(12) United States Patent
Itasaka

(10) Patent No.: US 6,711,792 B2
(45) Date of Patent: Mar. 30, 2004

(54) METHOD OF MANUFACTURING A PIEZOELECTRIC RESONATOR

(75) Inventor: Yasuhiro Itasaka, Toyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 208 days.

(21) Appl. No.: 09/939,890

(22) Filed: Aug. 27, 2001

(65) Prior Publication Data
US 2002/0003387 A1 Jan. 10, 2002

Related U.S. Application Data

(62) Division of application No. 09/432,614, filed on Nov. 3, 1999, now Pat. No. 6,300,708.

(30) Foreign Application Priority Data

Nov. 18, 1998 (JP) ............................................. 10-328503

(51) Int. Cl.⁷ ............................................. H04R 17/00
(52) U.S. Cl. .................. 29/25.35; 29/594; 29/602.1; 29/609.1; 310/320; 310/366; 310/367; 310/368; 216/39; 216/41; 333/150; 333/187; 333/193
(58) Field of Search .............................. 29/25.35, 594, 29/602.1, 609.1; 310/320, 366, 367, 368, 369; 216/39, 41; 333/150, 187, 193, 195, 196

(56) References Cited

U.S. PATENT DOCUMENTS

| 3,764,848 A | 10/1973 | Berlincourt | 310/366 |
| 4,431,938 A | * 2/1984 | Inoue | 310/348 |
| 4,503,350 A | 3/1985 | Nakatani | 310/366 |
| 4,628,285 A | 12/1986 | Nakatani et al. | 310/366 |
| 5,294,862 A | 3/1994 | Banno et al. | 310/366 |
| 5,859,488 A | 1/1999 | Okeshi et al. | 310/366 |
| 5,914,556 A | * 6/1999 | Tabota et al. | 310/328 |
| 5,973,442 A | 10/1999 | Irie | 310/366 |
| 5,991,988 A | * 11/1999 | Tabota et al. | 29/25.35 |
| 6,013,971 A | 1/2000 | Fujimoto | 310/366 |

FOREIGN PATENT DOCUMENTS

| JP | 59-9627 | 1/1984 | |
| JP | 1-236719 | 9/1989 | |
| JP | 03148906 A | * 6/1991 | H03H/3/02 |
| JP | 9-46166 | 2/1997 | |

OTHER PUBLICATIONS

"The effect of photo–refractively induced periodic strain grating on piezoelectric vibration in LiNbO3:Fe"; Ohki, M.; Taniguchi, N Shiosaki, T.; Applications of Ferroelectrics, 1992.; Aug. 30–Sep. 2, 1992; pp. 156–159.*

* cited by examiner

Primary Examiner—A. Dexter Tugbang
Assistant Examiner—Paul Kim
(74) Attorney, Agent, or Firm—Keating & Bennett, LLP

(57) ABSTRACT

A piezoelectric resonator is constructed to be vibrated in a square type vibration mode and to minimize the variations in the resonant frequency caused by the manufacturing process. The resonator includes a piezoelectric substrate having a pair of main surfaces, electrodes disposed on the pair of main surfaces and grooves provided on one of the main surfaces of the piezoelectric substrate. The grooves divide at least one of the electrodes into a plurality of divided electrodes. One of the plurality of divided electrodes defines an input/output electrode. A maximum distance between the outer edges of two of the grooves disposed opposite to each other across the input/output electrode is about 0.5 to about 0.55 times the length of one side edge of the piezoelectric substrate.

6 Claims, 14 Drawing Sheets

Front            Back
FIG. 6A
Piezoelectric Mother Substrate
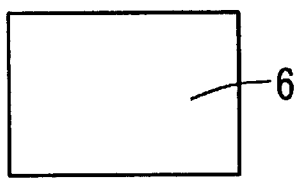
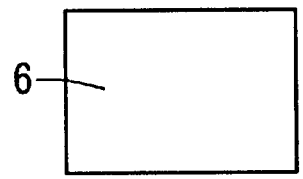
FIG. 6B
Forming Electrode
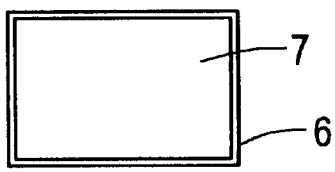
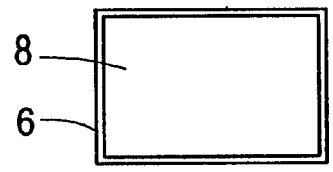
FIG. 6C
Polarization
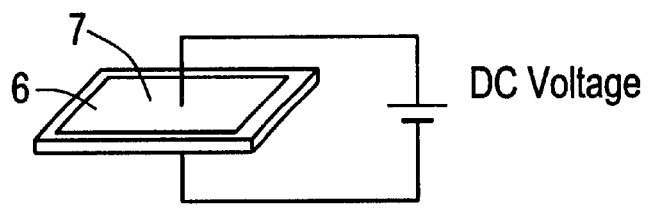
FIG. 6D
Cutting Forming Grooves
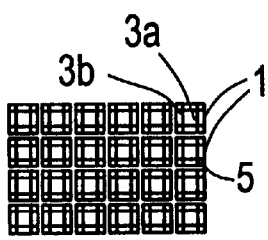
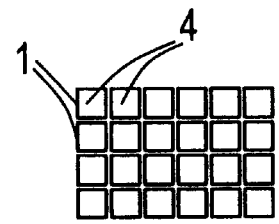

METHOD OF MANUFACTURING A PIEZOELECTRIC RESONATOR

This is a Divisional Application of U.S. patent application No. 09/432,614, filed on Nov. 3, 1999, now U.S. Pat. No. 6,300,708.

BACKGROUND OF THE INVENTION

1. Field of the Invention

The present invention relates to a piezoelectric resonator and a method of manufacturing thereof, in which the piezoelectric resonator is adapted to be vibrated in a square type vibration mode for use in an oscillator, a filter, a discriminator, a ladder type filter, or other apparatuses.

2. Background of the Related Art

Referring to FIG. 14, a structure of a conventional piezoelectric resonator 51 is shown. The piezoelectric resonator 51 is adapted to be vibrated in a square type vibration mode. The piezoelectric resonator 51 includes a piezoelectric substrate 52 having a square shape and first and second flat main surfaces. A partial electrode 53 is disposed on the center of the first main surface of the piezoelectric substrate 52 and a whole-surface electrode 54 is disposed on the second main surface so as to cover an entire surface thereof.

The piezoelectric resonator 51 is characterized by its resonant frequency. Moreover, the piezoelectric resonator 51 has a damping property so that if the resonator 51 is used in a ladder filter, or other similar apparatus, the resonator 51 is characterized by its electrostatic capacitance. Therefore, when manufacturing the piezoelectric resonator 51, controlling the value of the resonant frequency or the electrostatic capacitance is essential. The electrostatic capacitance is controlled by adjusting the area of the partial electrode 53.

However, in the conventional piezoelectric resonator 51, it is necessary to provide electrically conductive paste on both main surfaces of the piezoelectric substrate 52 to define the electrodes. One of the electrodes is then patterned via etching to define the partial electrode 53. However, the outline of the partial electrode 53 becomes faded by bleeding and blurring of the resist ink that is used for the etching process. Further, the partial electrode 53 may become deformed by the distortion in the printed pattern of the resist ink. These manufacturing problems degrade the electrical properties of the piezoelectric resonator 51. Additionally, because the partial electrode 53 is defined by an etching process with the resist ink acting as the etching mask, the etching liquid corrodes the piezoelectric substrate 52. This may also degrade the electrical properties of the piezoelectric resonator 51.

One way to overcome the above-mentioned problems is by making a piezoelectric resonator 61 as shown in FIG. 15. The piezoelectric resonator 61 is made by dividing an electrode into partial electrode 63a for input-output, and defining other partial electrodes 63b (electrodes in which an electrical signal is not transmitted) by cutting grooves 64 in the piezoelectric substrate 62. This method does not require that etching be performed on the electrodes disposed on the main surfaces.

So by making a piezoelectric resonator as shown in FIG. 15, the above-mentioned problems caused by the etching process are overcome. Further, in the piezoelectric resonator 61, a space B, which is equal to the distance between the center lines of the grooves, is defined so that the desired electrostatic capacitance and a mechanical coupling coefficient is obtained. Moreover, a length L of one edge of the piezoelectric resonator 61 is defined so that the desired resonant frequency is obtained. Finally, to prevent the variation of the resonator characteristics which occurs in every piezoelectric resonator, the width and depth of the grooves are set at appropriate fixed values.

Note that when defining the grooves 64 to have a fixed depth in the piezoelectric resonator 61, the piezoelectric resonator 61 is first placed on a fixed board. The resonator 61 is then cut by horizontally moving a precise cutting apparatus, such as a cutting saw, to define the grooves 64. Referring to FIG. 16, the depth D of the groove 64 is equal to the difference between the total thickness T and the remaining thickness N of the piezoelectric resonator 61. Note that the depth D is equal to the distance from the surface of fixed board to the lowest point in the groove 64.

However, a significant drawback of the piezoelectric resonator 61 is that it is difficult and complicated to make. It is especially difficult to detect the position of the surface of the piezoelectric resonator 61 (the thickness of the piezoelectric substrate 62) every single time to define the groove 64 in the piezoelectric resonator 61, especially in a mass-production environment. Note that the variation in thickness of the piezoelectric substrate 62 can be comparatively large.

This drawback is illustrated in FIGS. 17A, 17B and 17C. If the thickness T1 of the piezoelectric resonator 61 is as small as shown in FIG. 17A, the depth D1 of the groove 64 of the piezoelectric resonator 61 becomes shallow, or if the thickness T2 of the piezoelectric resonator 61 is thick as shown in FIG. 17B, the depth D2 of the groove 64 of the piezoelectric resonator 61 becomes deep. Also, as shown in FIG. 17C, the thickness variation of the groove 64 that is cut into the piezoelectric substrate 61 is large when the piezoelectric substrate 62 has a curvature.

Therefore, in the above-described method, after the manufacture of a piezoelectric resonator, an additional step of resonance tuning is required. This results in increased difficulty, time and cost of manufacture and affects the resonance characteristics of the resonator.

SUMMARY OF THE INVENTION

To overcome the problems described above, preferred embodiments of the present invention provide a piezoelectric resonator and a method of manufacturing a piezoelectric resonator, where variations in the resonant frequency caused by a manufacturing process are greatly reduced while preventing any increase in cost or difficulty of the resonator manufacturing process.

According to a preferred embodiment of the present invention, a piezoelectric resonator constructed to be vibrated in a square type vibration mode includes a piezoelectric substrate having a first main surface and a second main surface, electrodes disposed on the first main surface and the second main surface, grooves provided in the first main surface of the piezoelectric substrate such that one of the grooves divides at least one of the electrodes so as to define a plurality of divided electrodes, and one of the plurality of divided electrodes defines an input/output electrode, and a maximum distance between outer edges of two of the grooves disposed opposite to each other across the input/output electrode is about 0.5 to about 0.55 times the length of one side edge of the piezoelectric substrate.

The input/output electrode preferably has a substantially circular shape and is constructed so that the maximum distance defined above is substantially equal to the sum of the diameter of the input/output electrode and two times the width of the groove.

Thus, it was discovered that the relationship between the ratio of the maximum distance between the outer edges of two of the grooves disposed opposite to each other across the input/output electrode to the length of the edge of a piezoelectric substrate, a resonance frequency, the depth of the groove provided in the piezoelectric resonator, and the width of the groove, is such that the dependency of the resonance frequency on the depth of the groove is minimal when the ratio of the maximum distance between the outer edges of the two of the grooves disposed opposite to each other across the input/output electrode to the length of the edge of a piezoelectric substrate is within a range of about 0.5 to about 0.55 and the width of the groove is constant.

In another preferred embodiment of the present invention, a method of manufacturing a piezoelectric resonator constructed to be vibrated in a square type vibration mode includes the steps of providing a piezoelectric mother substrate having first and second main surfaces, forming electrodes on substantially an entire area of the first and second main surfaces of the piezoelectric mother substrate, dividing at least one of the electrodes into a plurality of divided electrodes by forming a plurality of grooves on one of the first and second main surfaces of the piezoelectric mother substrate, one of the plurality of divided electrodes defining an input/output electrode, and dividing the piezoelectric mother substrate into an individual piezoelectric substrate constituting a piezoelectric resonator such that one side edge of the piezoelectric substrate is about 0.50 to about 0.55 times the length of a maximum distance between the outer edges of two of the grooves disposed opposite to each other across the input/output electrode.

Accordingly, when forming the grooves on the piezoelectric resonator, the dependency of the resonance frequency on the depth of the groove is minimized by setting the ratio of the maximum distance between the outer edges of two of the grooves disposed opposite to each other across the input/output electrode to the length of the edge of a piezoelectric substrate in a range of about 0.5 to about 0.55. Thereby, variation of the resonance frequency in the manufacturing process is substantially eliminated. The resonance frequency of the piezoelectric resonator is thus stabilized and the necessity of tuning the resonance frequency after manufacture of the piezoelectric resonator is significantly reduced.

This method is capable of manufacturing a plurality of the above described piezoelectric resonators simultaneously. Even if the thickness of the piezoelectric mother substrate is not completely uniform, a plurality of the above described piezoelectric resonators having the same resonance frequency can be manufactured simultaneously.

Other features, elements and advantages of the present invention will be described in detail below with reference to preferred embodiments of the present invention and attached drawings.

BRIEF DESCRIPTION OF DRAWINGS

FIG. 6A–FIG. 6D show a process of manufacturing a resonator according to a preferred embodiment of the present invention shown in FIG. 1;

DETAILED DESCRIPTION OF PREFERRED EMBODIMENTS

Figure 1:
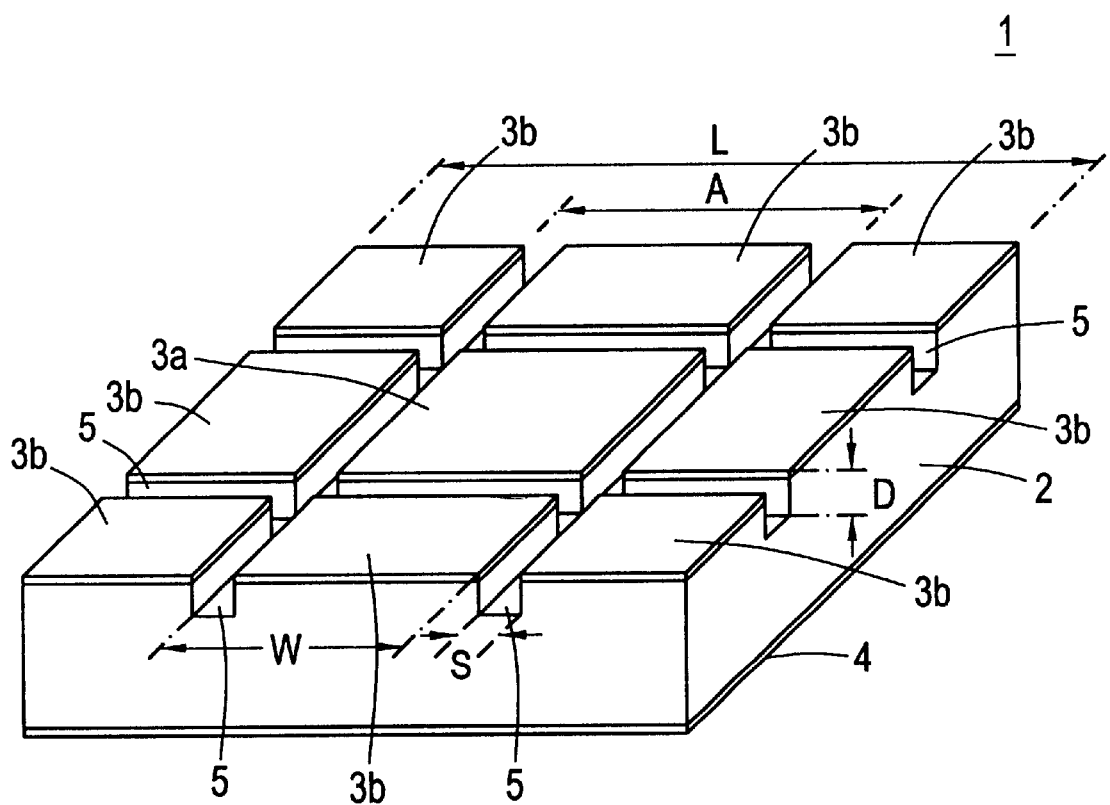
FIG. 1 is a perspective view of a piezoelectric resonator according to a preferred embodiment of the present invention.

FIG. 1 is a perspective view of a piezoelectric resonator constructed to be vibrated in a square type vibration mode according to a preferred embodiment of the present invention. In the piezoelectric resonator 1, electrodes are preferably disposed on substantially the entire area of first and second main surfaces of a piezoelectric substrate 2. The piezoelectric substrate 2 is preferably made of polarized piezoelectric-ceramic material.

On one of the main surfaces of the piezoelectric substrate 2, electrodes 3a and 3b are preferably divided into sections that are defined by a plurality of linear grooves 5 on the piezoelectric substrate 2. The electrode 3a, which is one of a plurality of divided electrodes, preferably defines an input/output electrode. Also, the ratio A/L is preferably within a range of about 0.5 to about 0.55, where A is the distance between the two outer edges of the grooves located opposite to each other across the electrode 3a and L is the length of one side edge of the piezoelectric substrate. In other words, in this preferred embodiment, the relationship 0.5(L)(A)=W+2S(0.55)(L) is preferably satisfied, where W is the width of the input/output electrode 3a, and S is the width of the groove 5.

Note that the electrodes 3a and 3b are electrically insulated from each other. The electrode 3a defines an input/output electrode as described above, and is preferably located at the approximate center of the piezoelectric resonator 1. A plurality of the electrodes 3b are located at the periphery of the piezoelectric resonator 1 and define disconnected lines so that the electrodes 3b do not function as electrodes of the piezoelectric resonator 1.

On the second main surface of the piezoelectric substrate 2, an electrode 4 is disposed preferably on substantially the entire area of the substrate 2 continuously and uniformly. The electrode 4 defines a whole-surface electrode for signal input-output in the piezoelectric resonator 1.

In the piezoelectric resonator 1, the width of the grooves 5 is determined by the thickness of the blade that is used in the cutting process since the grooves are defined by cutting the piezoelectric substrate using a precise cutting apparatus such as a cutting saw or other cutting mechanism. Accordingly, the variation in the groove width is small, so that the effect of the groove width on the resonant frequency is small.

However, the depth "D" in the groove 5 suffers from large variations as mentioned above. As a result, the effect on the resonant frequency caused by variations in the groove depth D is considerable. To overcome this problem, in preferred embodiments of the present invention, the ratio A/L is preferably within a range of about 0.5 to about 0.55. By setting the ratio A/L within the above-mentioned range, the variations in the frequency of the piezoelectric resonator 1 are minimized and the characteristics of the piezoelectric resonator 1 are stabilized, even if the depth D of the groove 5 fluctuates due to the variation in the thickness of the piezoelectric substrate 2.

Figure 2:
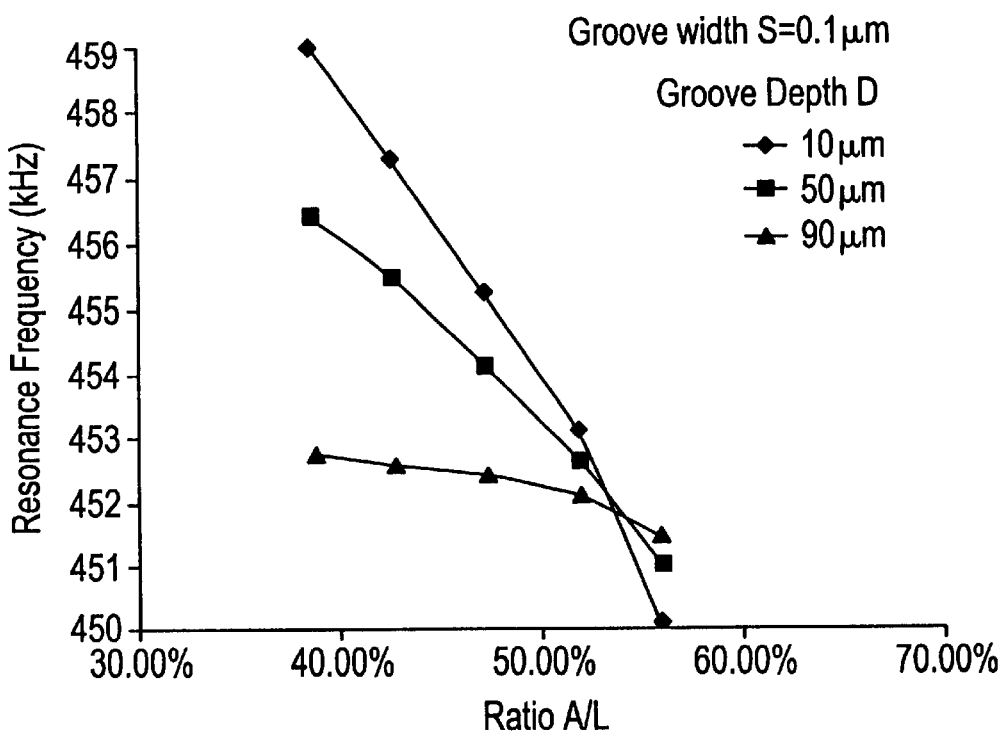
FIG. 2 is a graph showing the relationship between the ratio A/L and the resonant frequency when the width of the groove is approximately 0.1 micrometers.
Figure 3:
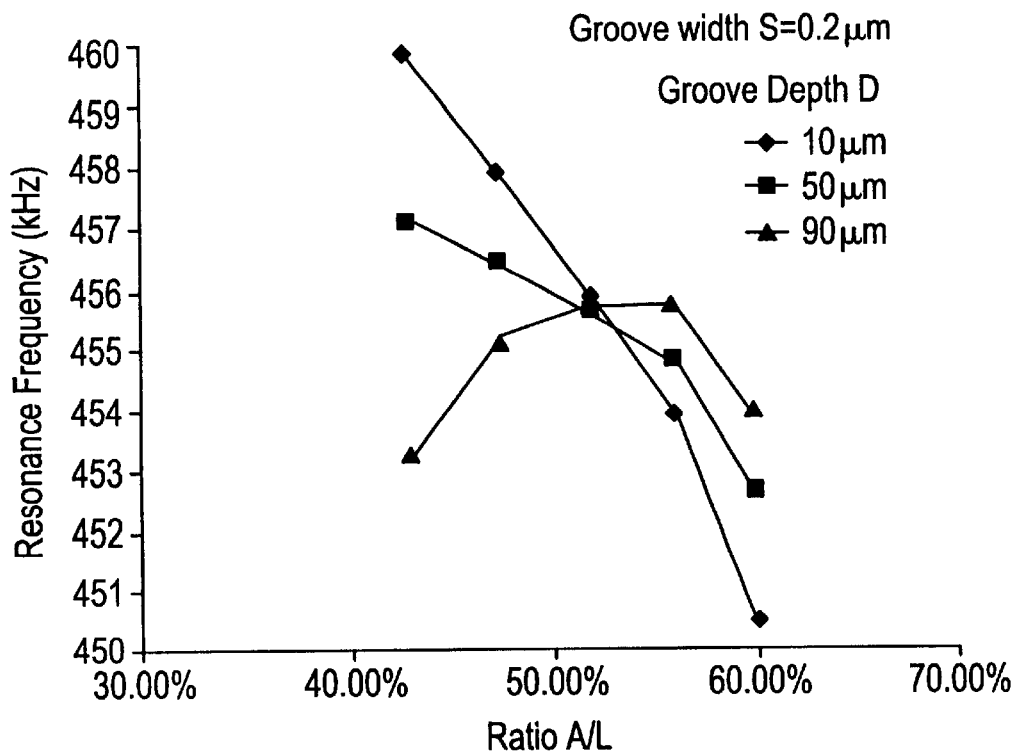
FIG. 3 is a graph showing the relationship between the ratio A/L and the resonant frequency when the width of the groove is approximately 0.2 micrometers.
Figure 4:
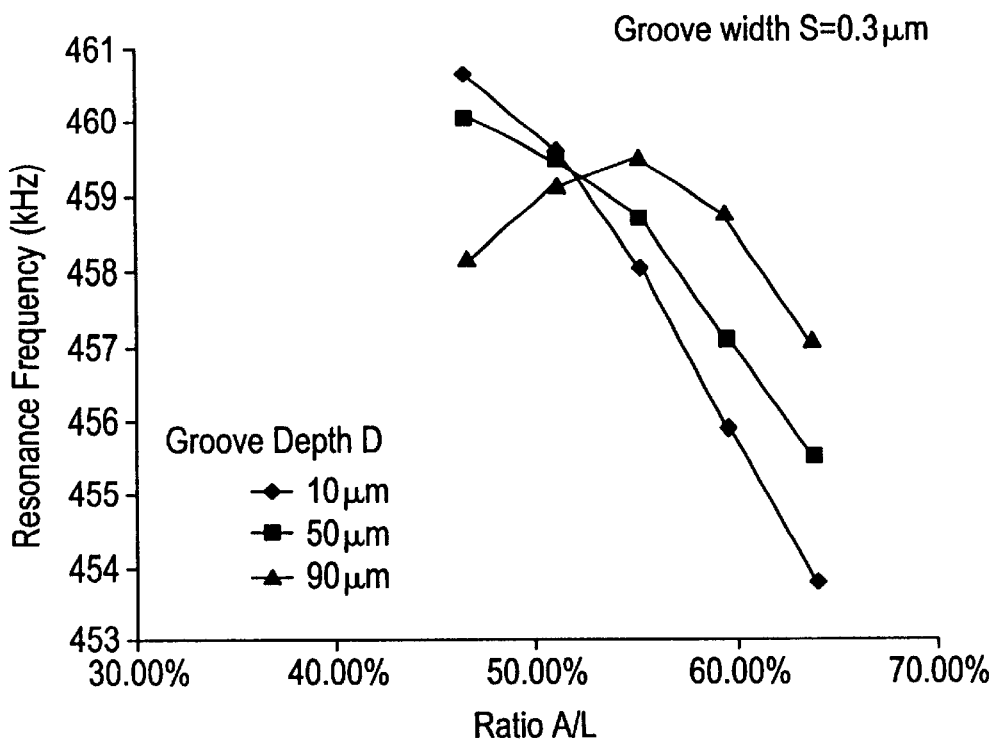
FIG. 4 is a graph showing the relationship between the ratio A/L and the resonant frequency when the width of the groove is approximately 0.3 micrometers.
Figure 5:
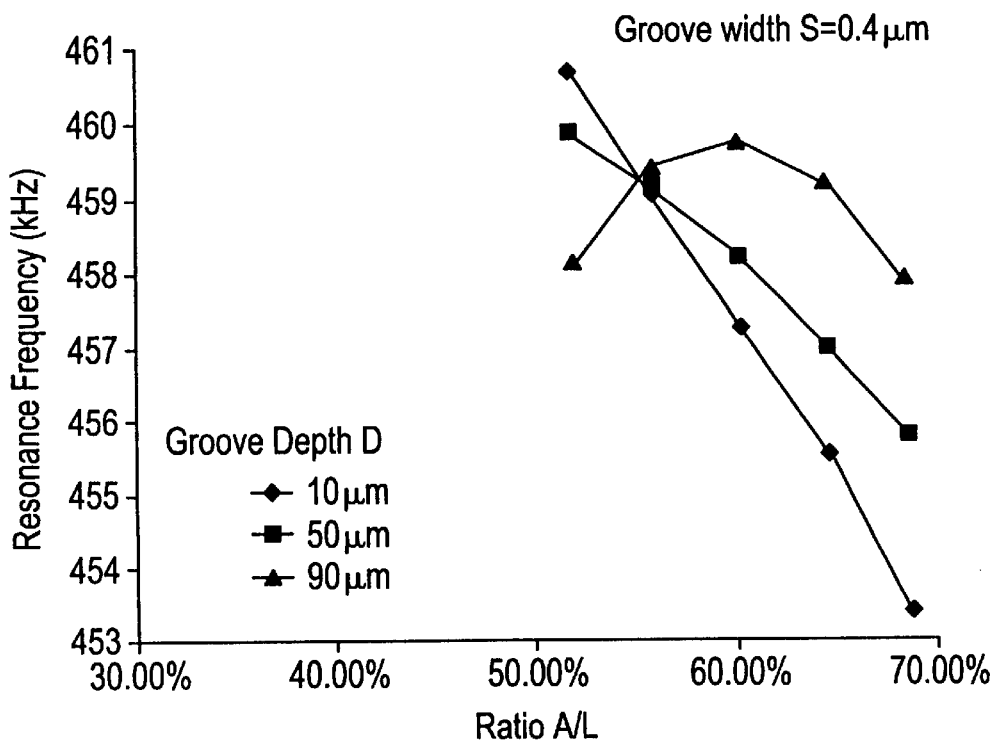
FIG. 5 is a graph showing the relationship between the ratio A/L and the resonant frequency when the width of the groove is approximately 0.4 micrometers.

FIGS. 2 to 5 are graphs that show experimental data explaining the above-mentioned effect of the ratio A/L. These graphs indicate the change in resonant frequency of the piezoelectric resonator 1 with respect to the ratio A/L with various values of the groove-width S and groove-depth D. FIG. 2 is a graph that shows the relationship between the ratio A/L and the resonant frequency when the width S of the groove 5 is about 0.1 micrometers and the groove-depth D is about 10 micrometers, about 50 micrometers, and about 90 micrometers, respectively. FIGS. 3, 4 and 5 are similar graphs when the width S of the groove 5 is set at about 0.2 micrometers, about 0.3 micrometers and about 0.4 micrometers, respectively.

Referring to FIG. 2, when the width S of the groove 5 is about out 0.1 micrometers, the resonant-frequency characteristic curves with a depth D of about 10 micrometers, about 50 micrometers, and about 90 micrometers, respectively, converge where the ratio A/L is within a range of about 53% to about 54%.

From FIG. 3, when the width S of the groove 5 is 0.2 micrometers, the resonant-frequency characteristic curves with a depth D of about 10 micrometers, about 50 micrometers, and about 90 micrometers, respectfully, converge where the ratio A/L is within a range of about 51% to about 53%.

From FIG. 4, when the width S of the groove 5 is about 0.3 micrometers, the resonant-frequency characteristic curves with a depth D of about 10 micrometers, about 50 micrometers, and about 90 micrometers, respectively, converge where the ratio A/L is within a range of about 52% to about 53%.

From FIG. 5, when the width S of the groove 5 is about 0.4 micrometers, the resonant-frequency characteristic curves with a depth D of about 10 micrometers, about 50 micrometers, and about 90 micrometers converge where the ratio A/L is about 55%.

Accordingly, as long as the widths S of the grooves are substantially the same, the resonant-frequency characteristic curve converge where the ratio A/L is within a range of about 0.5 to about 0.55.

Therefore, if the piezoelectric resonator 1 as shown in FIG. 1, is constructed so that the ratio A/L is within a range of about 0.5 or more and about 0.55 or less, the variations in the frequency of the piezoelectric resonator 1 are minimized and the characteristics of the piezoelectric resonator 1 are stabilized, even if the depth D of the groove 5 fluctuates due to the variation in the thickness of the piezoelectric substrate during the manufacturing process.

Referring to FIGS. 6A–6D, a process of manufacturing a preferred embodiment of the present invention as shown in FIG. 1 will be explained.

First referring to FIGS. 6A and 6B, electrically-conductive paste, such as silver paste, is provided and baked on substantially the entire area of a pair of main surfaces of a piezoelectric mother substrate 6, which is preferably formed of piezoelectric material, so as to form electrodes 7 and 8.

Referring to FIG. 6C, the piezoelectric mother substrate 6 is polarized by applying a DC voltage between the two main surfaces of the piezoelectric mother substrate 6 via the electrodes 7 and 8.

Referring to FIG. 6D, the piezoelectric mother substrate 6 is preferably cut into a plurality of individual piezoelectric resonators 1 and while simultaneously forming grooves having a predetermined width S and depth D on each of the piezoelectric resonators 1 by using a precise cutting apparatus, such as a cutting saw. During this process, the ratio A/L is preferably set within a range of about 0.5 to about 0.55.

In another preferred embodiment of the present invention, the step of cutting the piezoelectric mother substrate 6 into a plurality of the piezoelectric resonators 1 and the step of defining the grooves 5 in each of the piezoelectric resonators 1 may be performed separately.

Because the piezoelectric resonator 1 of preferred embodiments of the present invention can be manufactured in the above-described way, the manufacturing process is greatly simplified so that the manufacturing time and cost are greatly reduced compared to the conventional method of defining an electrode. Further, because an etching process is not used to define the electrodes, factors that contribute to degrading the electrical properties of the piezoelectric resonator 1, such as deformation of the electrodes by the distortive effect of the printing pattern of a resist ink, and diffusion of the electrodes by bleeding and blurring that is caused by the resist ink, and also corrosion of the piezoelectric substrate 2 by the etching liquid, are all eliminated. Thus, the electrical properties of the piezoelectric resonator 1 are greatly improved.

Further, since the steps of cutting the piezoelectric mother substrate 6 into a plurality of individual piezoelectric resonators 1 and the step of defining the grooves 5 on each of the piezoelectric resonators 1 are combined into one step (FIG. 6D), the manufacturing process is greatly simplified. Thus, the position gap of the groove 5 relative to the piezoelectric resonator 1 does not occur, and so the variations in the resonant frequency of the piezoelectric resonator 1 are greatly reduced.

Figure 7:
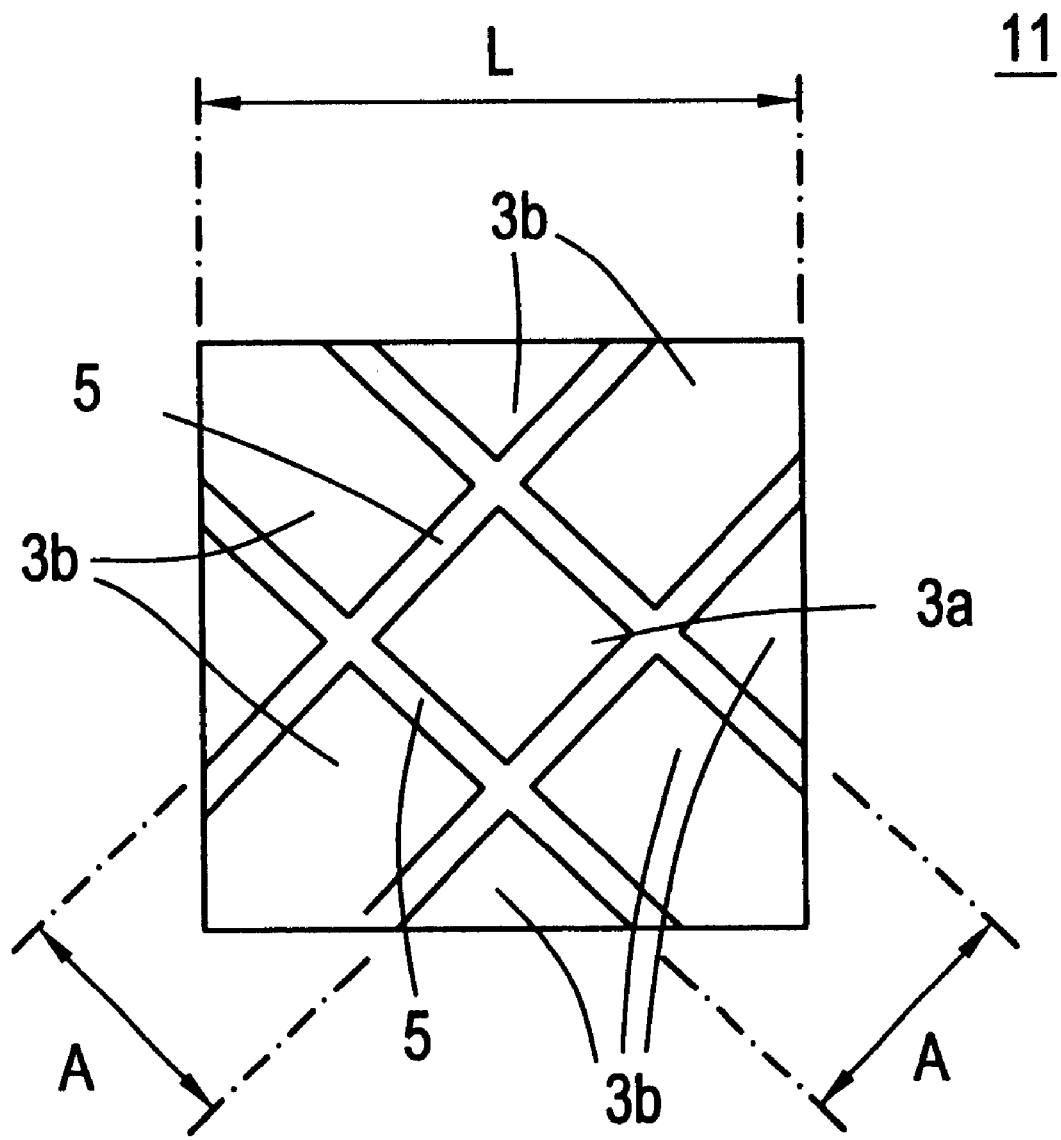
FIG. 7 is a top view of a piezoelectric resonator according another preferred embodiment of the present invention.

In the piezoelectric resonator 1 having the structure shown in FIG. 1, it is preferable that the shape of the electrode 3a is substantially square. However, the direction of the groove 5 does not need to be parallel to each edge of the piezoelectric substrate 2. As shown in FIG. 7, a substantially square shaped electrode 3a located approximately at the center portion of the piezoelectric resonator 1 can be defined by the grooves 5, which are inclined with respect to each edge of the piezoelectric substrate 2. If the area of the electrodes are substantially equal, an equal electrostatic capacitance will be obtained regardless of the inclination of the grooves. In this preferred embodiment, the distance A, which is a distance between the outer edges of two of the grooves 5 opposite each other across the input/output electrode 3a, and the length L, which is the length of one side edge of the piezoelectric substrate 2, is defined as shown in FIG. 7.

Note that the electrode 3a, which is used for signal input/output in the piezoelectric resonator 1 constructed to vibrate in a square type vibration mode, may have any shape. To obtain desired electrical properties without distortion, it is preferable that the electrode 3a has a shape of a substantially regular polygon with many angles or that the electrode 3a be substantially circular. But to provide an easy and simple manufacturing process, it is preferable that the electrode 3a have a shape of substantially regular polygon with a small number of angles.

Figure 8:
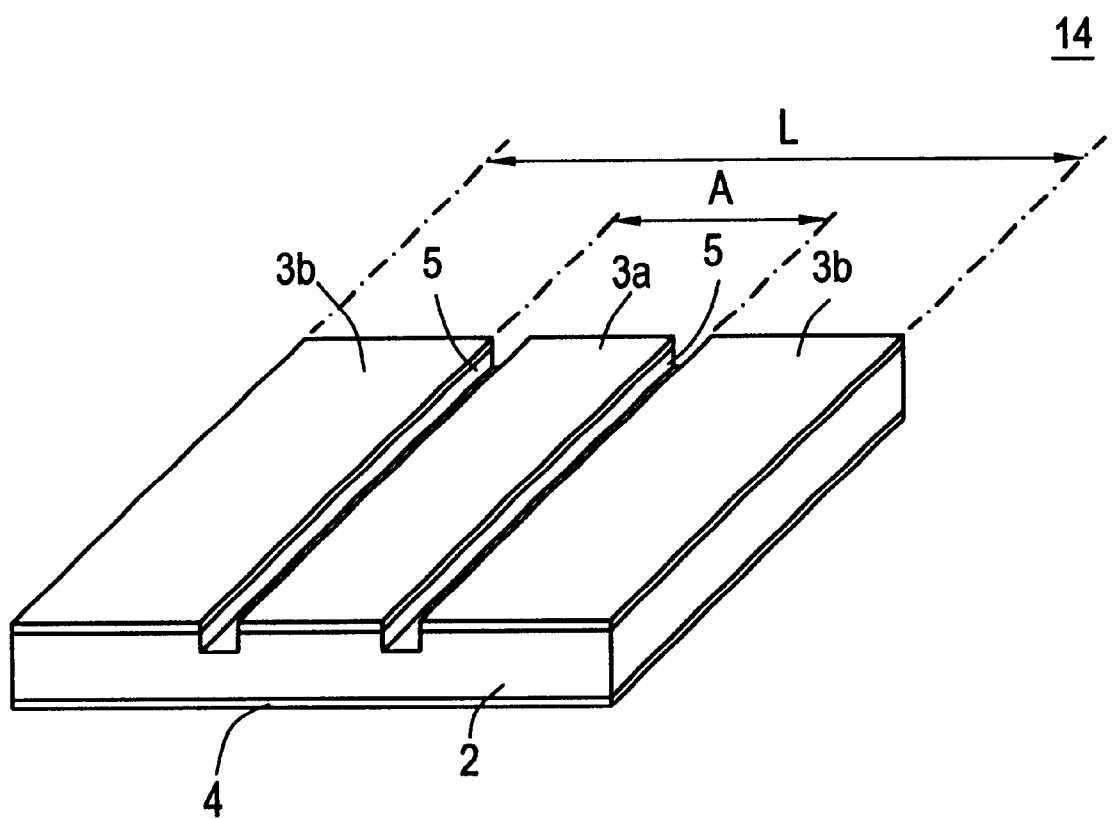
FIG. 8 is a perspective view of a piezoelectric resonator according to another preferred embodiment of the present invention.

To further simplify the manufacturing process, it is preferable that the groove 5 have a substantially linear shape. Moreover, in another preferred embodiment of the present invention, only two grooves 5 disposed substantially parallel to each other may be defined on the piezoelectric substrate 2, as shown in FIG. 8. In this preferred embodiment, the distance A and the length L is defined as shown in FIG. 8.

Figure 9:
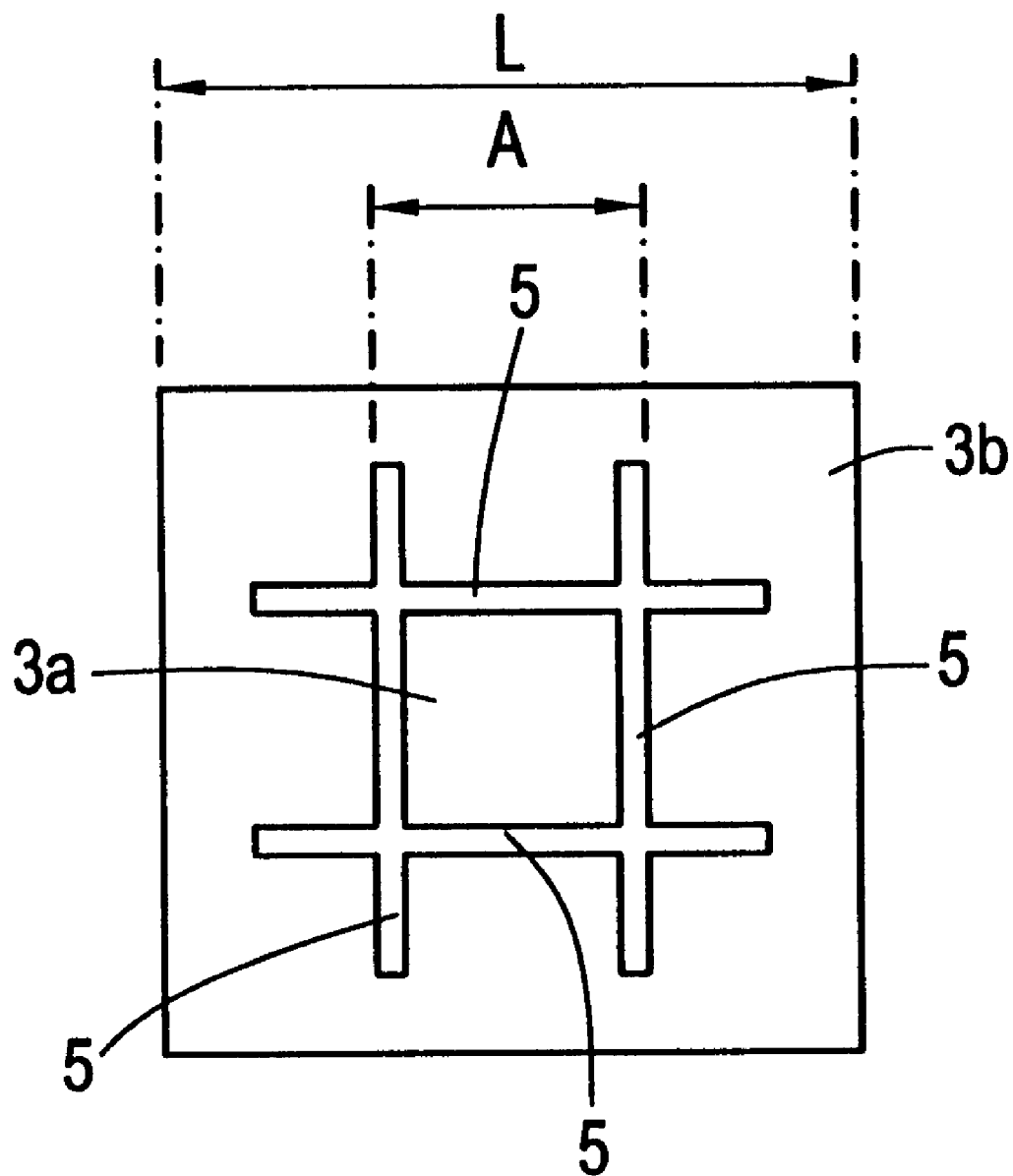
FIG. 9 is a top view according to another preferred embodiment of the present invention.

Additionally, in another preferred embodiment, the grooves 5 do not necessarily need to extend from one end of the piezoelectric substrate 2 to another end. As shown in FIG. 9, as long as the electrode 3a and the electrodes 3b are divided and electrically insulated, the groove 5 can be formed partially. In this case, the distance A and the length L is defined as shown in FIG. 9.

Moreover, if in the preferred embodiment the electrode that defines the input/output electrode is substantially circular, the distance A described above is the sum of the diameter of the input/output electrode and two times the width of the groove.

In preferred embodiments, the grooves that were previously discussed divided the electrode on only one main surface of the piezoelectric substrate. However, the grooves may be defined on both of the two main surfaces of the piezoelectric substrate so as to divide the electrodes on the two main surfaces.

Figure 10A:
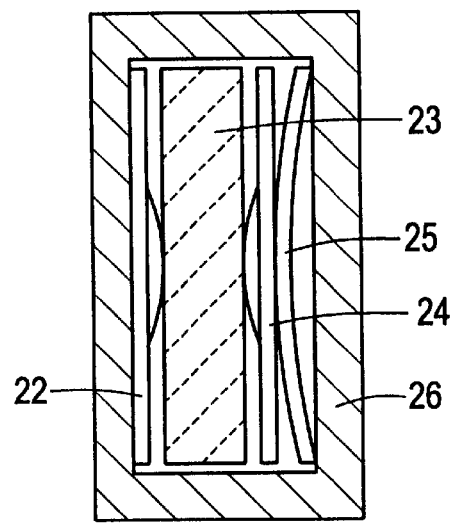
FIG. 10A is a plane cross-section view of an oscillator, a filter or a discriminator according to preferred embodiments of the present invention.
Figure 10B:
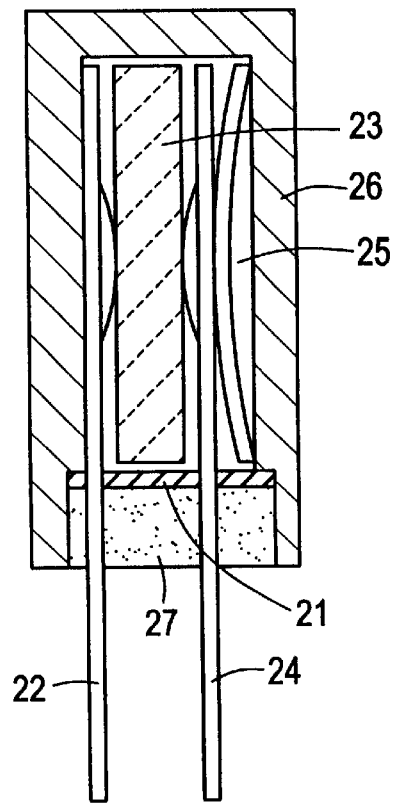
FIG. 10B is a longitudinal cross-section view of an oscillator, a filter, or a discriminator according to preferred embodiments of the present invention.
Figure 11:
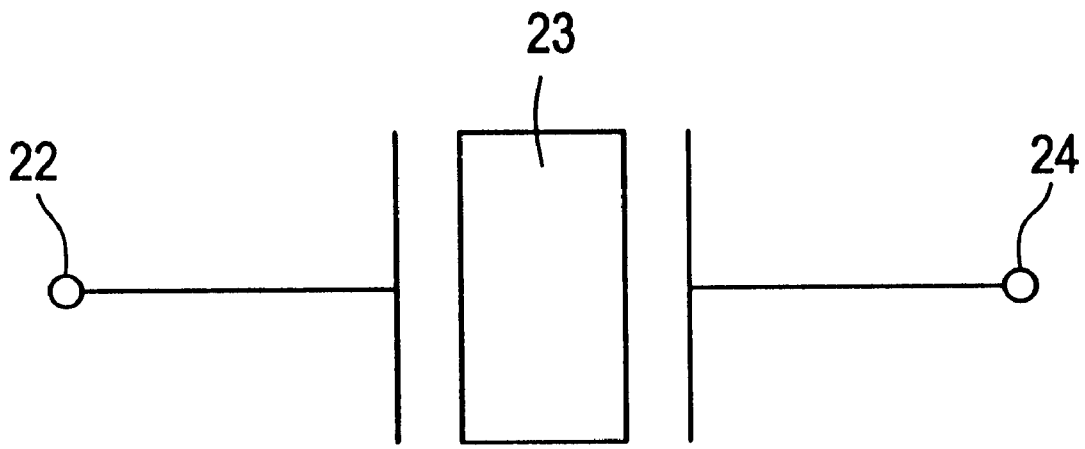
FIG. 11 is a diagram showing the equivalent-circuit of the oscillator, filter, or discriminator according to preferred embodiments of the present invention as shown in FIGS. 10–10B.

FIGS. 10A and 10B are a plane cross-section view and a longitudinal cross-section view, respectively, showing the structure of an oscillator, a filter, or a discriminator using the piezoelectric resonator of preferred embodiments of the present invention. FIG. 11 is a diagram of the equivalent-circuit of the above-mentioned oscillator, filter, or discriminator. A piezoelectric resonator 23 has electric properties necessary for use as an oscillator, filter, or discriminator. In the base 21, which is preferably made of an insulating material, terminals 22 and 24 extract the electrical property of the piezoelectric resonator 23 which passes through the gap therebetween. The case 26 covers the upper part of a base 21, the terminal 22, the piezoelectric resonator 23, and the terminal 24. The piezoelectric resonator 23 and the terminals 22 and 24 are compressed together by a spring terminal 25 which is placed between the terminal 24 and the interior of the case 26, and is electrically connected with each other. Under the base 21, a sealing agent 27 fills up with the lower aperture of the case 26.

Figure 12A:
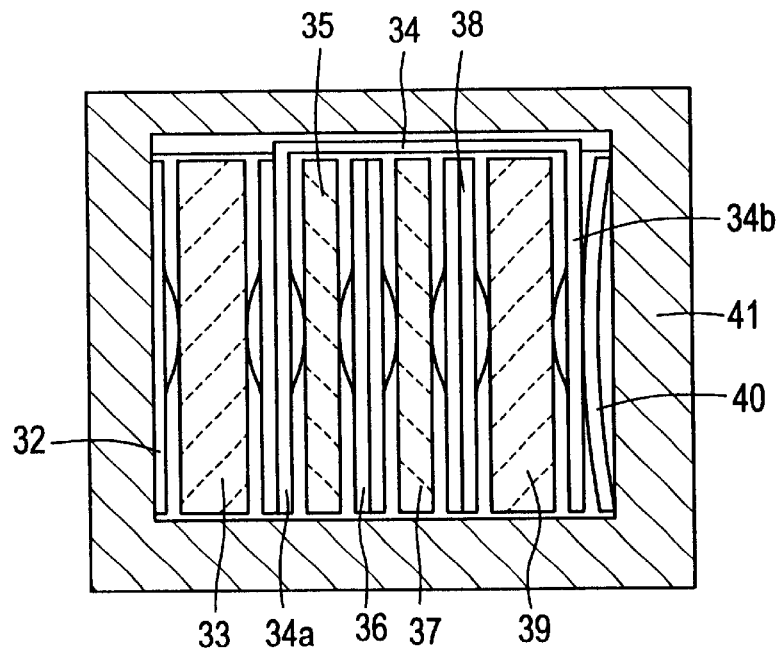
FIG. 12A is a plane cross-section view of a ladder filter according to preferred embodiments of the present invention.
Figure 12B:
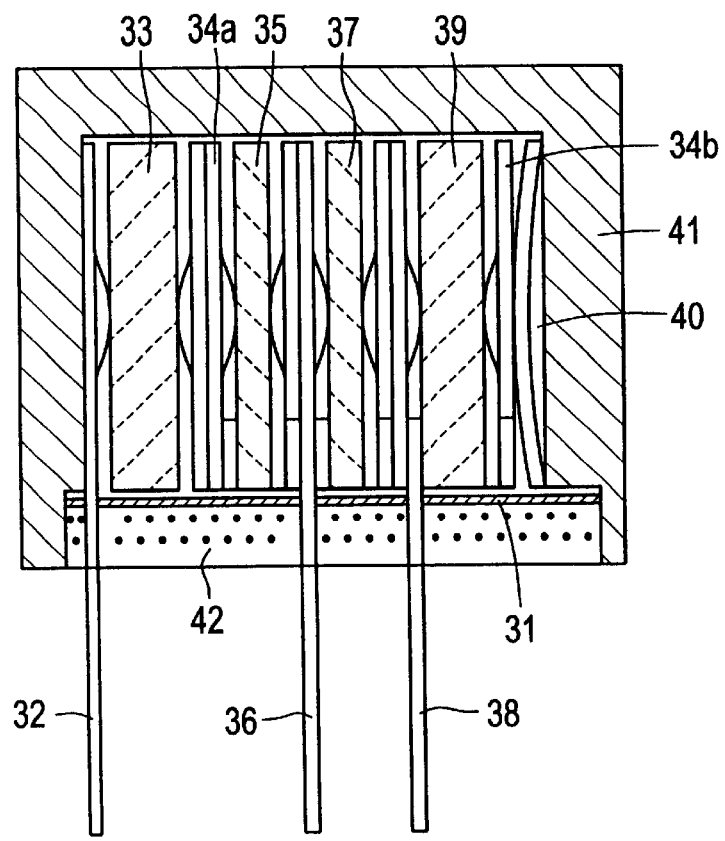
FIG. 12B is a longitudinal cross-section view of a ladder filter according to preferred embodiments of the present invention.

FIGS. 12A and 12B are a plane cross-section diagram and a longitudinal cross-section view, respectively, of a structure of a ladder filter using the piezoelectric resonator of preferred embodiments of the present invention. In the base 31 which is preferably made of an insulating material, an input terminal 32, a ground terminal 36 and an output terminal 38 extends therethrough with corresponding gaps therebetween. The case 41 covers the upper part of the base 31, an input terminal 32, a first piezoelectric resonator 33, electrode 34a of a substantially U-shaped terminal 34, a second piezoelectric resonator 35, the ground terminal 36, a fourth piezoelectric resonator 37, the output terminal 38, a third piezoelectric resonator 39, and electrode 34b of the substantially U-shaped terminal 34. Each of the resonators 33, 35, 37 and 39 and each of the terminals 32, 36 and 38 are compressed together by a spring terminal 40 placed between the electrode 34b of the substantially U-shaped terminal 34 and the interior of the case 41, and is electrically connected with each other. Under the base 31, a sealing agent 42 fills up the lower aperture of the case 41.

Figure 13:
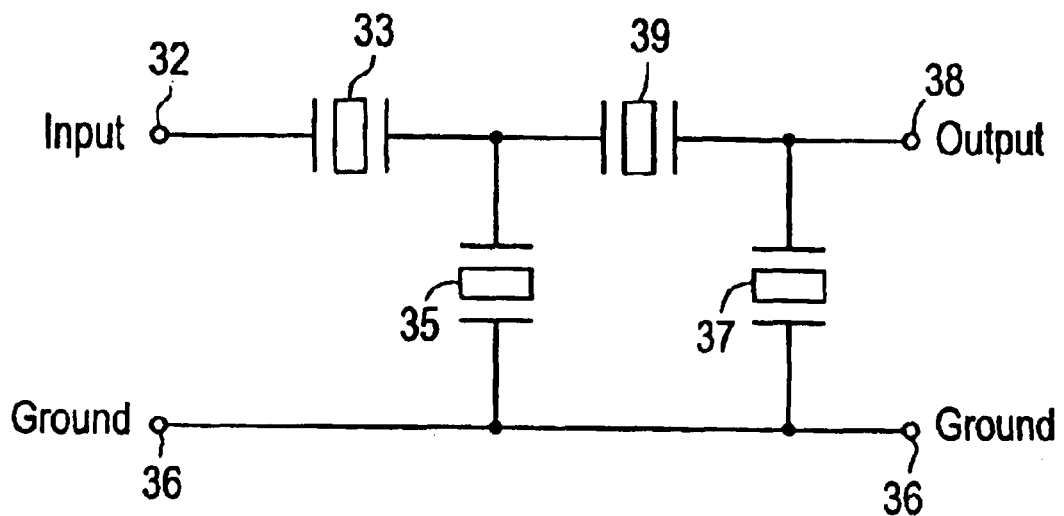
FIG. 13 is a diagram that shows the equivalent-circuit of the ladder filter according to preferred embodiments of the present invention as shown in FIGS. 12A–12B.
Figure 14:
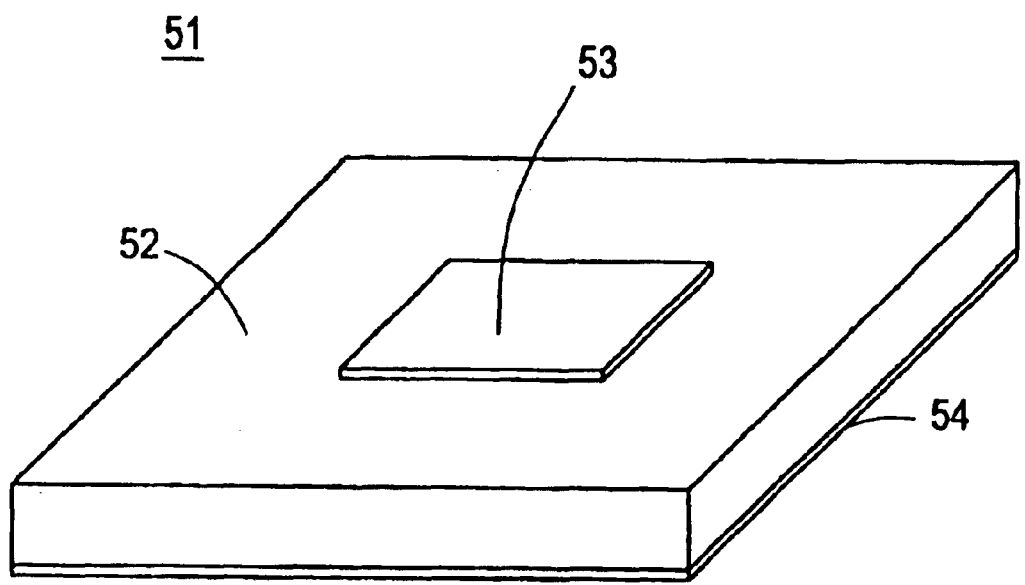
FIG. 14 is a perspective view of a conventional piezoelectric resonator.
Figure 15:
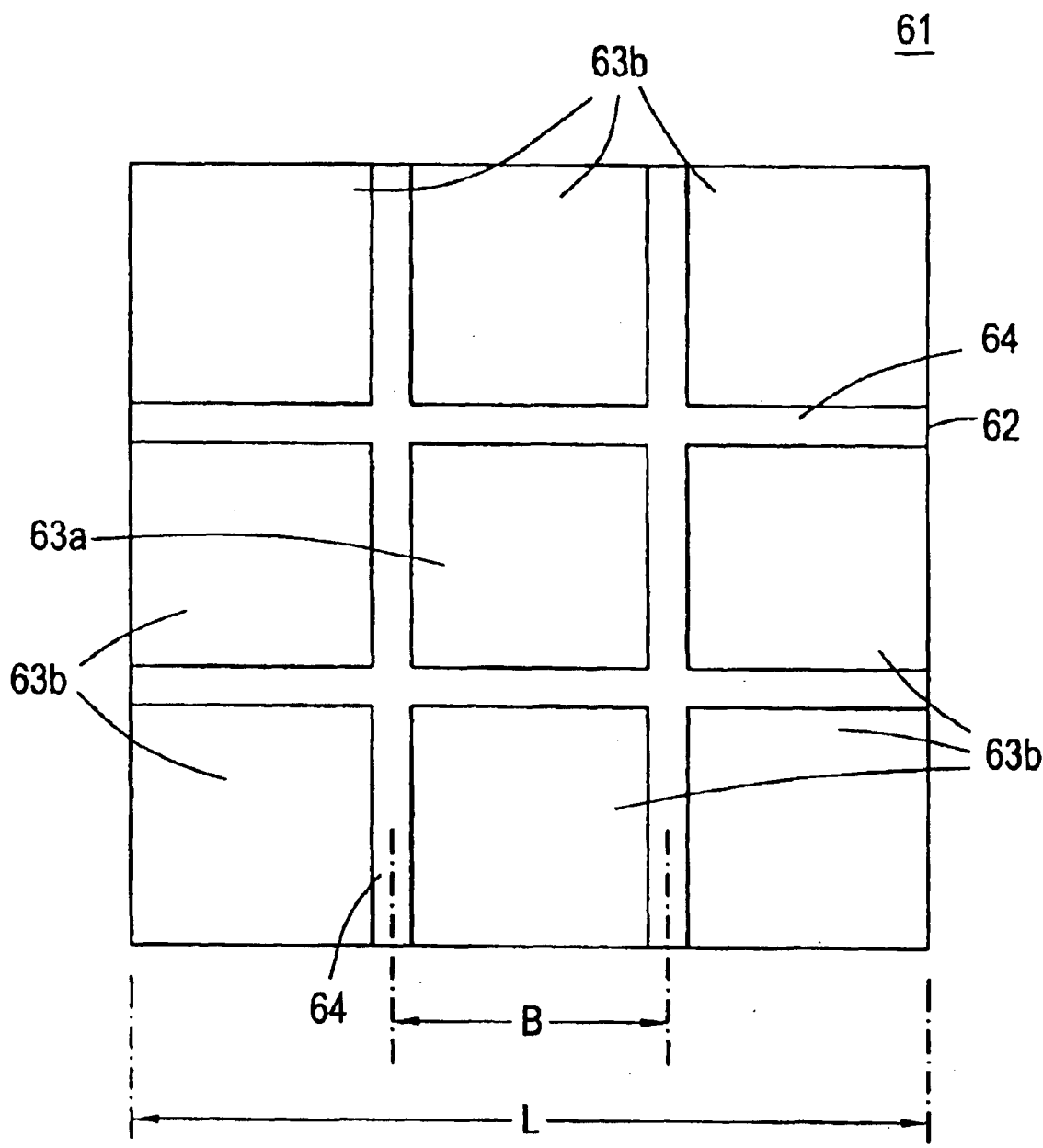
FIG. 15 is a top view of a piezoelectric resonator according to a conventional device.
Figure 16:
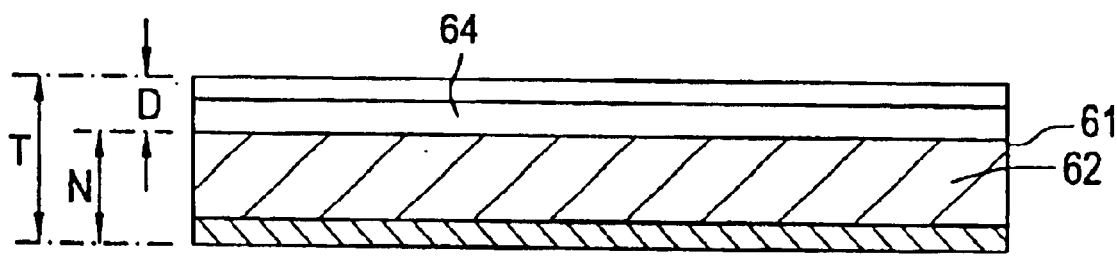
FIG. 16 shows a process of cutting a groove on a piezoelectric substrate according to a conventional method.
Figure 17A:
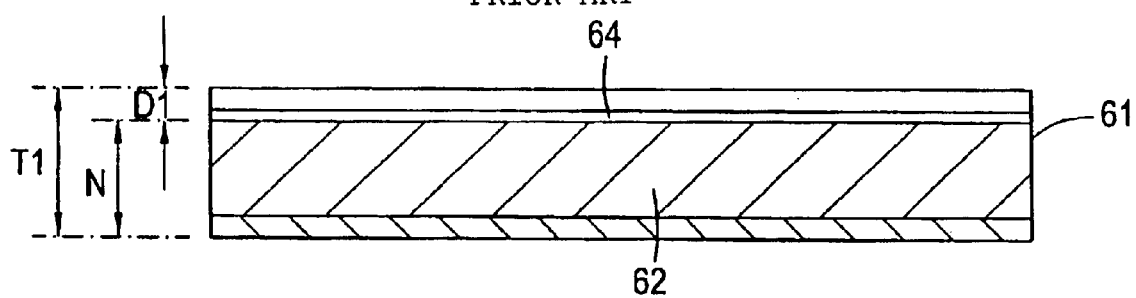
FIG. 17A–FIG. 17C show the relationship between the thickness of the piezoelectric resonator and the depth of the groove.
Figure 17B:
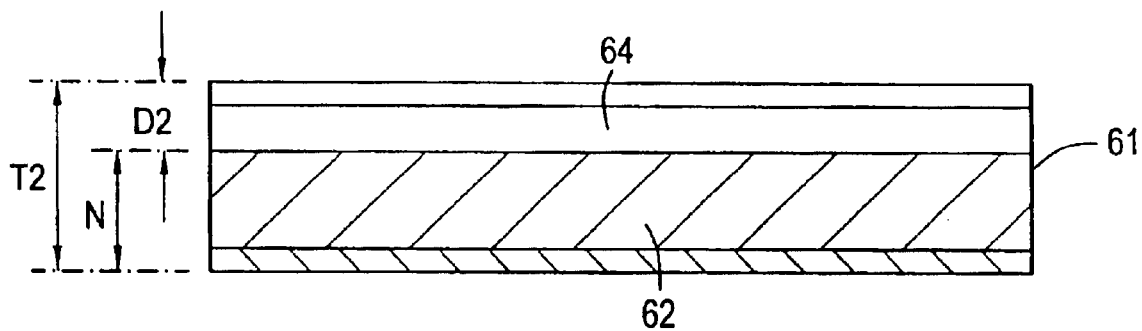
Figure 17C:
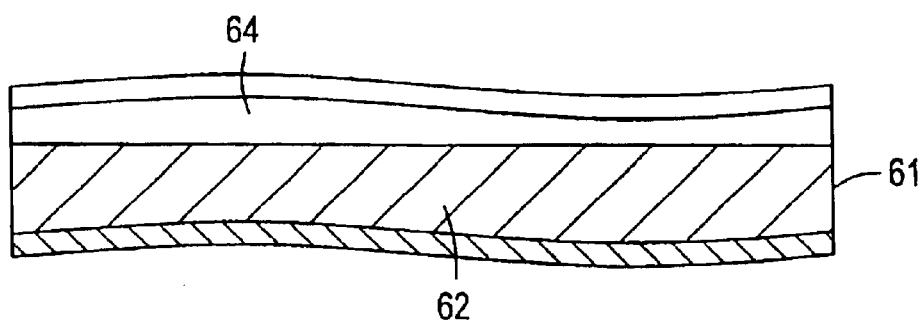

FIG. 13 is a diagram of the equivalent-circuit of the above-mentioned ladder filter. The first and third piezoelectric resonators 33 and 39 have electrical characteristics of serial resonators. The second and fourth piezoelectric resonators 35 and 37 have electrical characteristics of parallel resonators. The input terminal 32 is electrically connected to the first piezoelectric resonator 33 and an input signal propagates to the first piezoelectric resonator 33. The substantially U-shaped terminal 34 is electrically connected to the first piezoelectric resonator 33, the second piezoelectric resonator 35 and the third piezoelectric resonator 39, and the electrical signal output from the first piezoelectric resonator 33 propagates to the second piezoelectric resonator 35 and the third piezoelectric resonator 39. The ground terminal 36 is electrically connected to the second piezoelectric resonator 35 and the fourth piezoelectric resonator 37, and the electrical signal outputted from the second piezoelectric resonator 35 and the fourth piezoelectric resonator 37 propagates to a ground. The output terminal 38 is electrically connected to the third piezoelectric resonator 39 and the fourth piezoelectric resonator 37, and the electrical signal outputted from the third piezoelectric resonator 39 and the fourth piezoelectric resonator 37 is sent as an output signal, and further an electrical signal also propagate to the fourth piezoelectric resonator 37.

While the invention has been particularly shown and described with reference to preferred embodiments thereof, it will be understood by those skilled in the art that the forgoing and other changes in form and details may be made therein without departing from the spirit of the invention.

What is claimed is:

1. A method of manufacturing a piezoelectric resonator comprising the steps of:

providing a piezoelectric mother substrate having a pair of main surfaces;

forming electrodes on the pair of the main surfaces of the piezoelectric mother substrate;

dividing at least one of the electrodes to form a plurality of divided electrodes by forming a plurality of grooves on one of the pair of main surfaces of the piezoelectric mother substrate, only one of the plurality of divided electrodes defining an input/output electrode, the remainder of the plurality of divided electrodes defining disconnected lines such that the remainder of the plurality of divided electrodes do not function as electrodes of the piezoelectric resonator; and dividing the piezoelectric mother substrate to form an individual piezoelectric resonator including an individual piezoelectric substrate such that a length of a maximum distance between the outer edges of two of the grooves disposed opposite to each other across the input/output electrode is about 0.50 to about 0.55 times a length of one side edge of the individual piezoelectric substrate is about 0.50 to about 0.55 times the length of a maximum distance between the outer edges of two of the grooves disposed opposite to each other across the input/output electrode; wherein the individual piezoelectric resonator including the individual piezoelectric substrate, said plurality of electrodes, and said plurality of grooves is configured to vibrate in a square vibration mode.

2. The method according to claim 1, wherein the step of forming electrodes includes forming and baking electrically-conductive paste on substantially an entire area of the pair of main surfaces of the piezoelectric mother substrate.

3. The method according to claim 1, further comprising the step of polarizing the piezoelectric mother substrate by applying a DC voltage between the pair of main surfaces of the piezoelectric mother substrate via the electrodes.

4. The method according to claim 1, wherein the steps of dividing at least one of the electrodes to form the plurality of divided electrodes by forming the plurality of grooves on one of the pair of main surfaces of the piezoelectric mother substrate and dividing the piezoelectric mother substrate to form the individual piezoelectric substrate are performed simultaneously.

5. The method according to claim 1, wherein a relationship $0.5<A/L<0.55(A=W+2S)$ is satisfied, where L is a length of one side edge of the individual piezoelectric substrate, W is a width of the input/output electrode, and S is a width of the one of the plurality of grooves.

6. The method according to claim 1, wherein a group of the plurality of the electrodes are located at the periphery of the individual piezoelectric resonator and define disconnected lines so that the electrodes do not function as electrodes of the individual piezoelectric resonator.

* * * * *